US011890652B2

(12) United States Patent
Toyomasu et al.

(10) Patent No.: US 11,890,652 B2
(45) Date of Patent: Feb. 6, 2024

(54) CLEANING CHEMICAL LIQUID SUPPLY DEVICE AND CLEANING CHEMICAL LIQUID SUPPLY METHOD

(71) Applicant: EBARA CORPORATION, Tokyo (JP)

(72) Inventors: Fujihiko Toyomasu, Tokyo (JP); Junji Kunisawa, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 0 days.

(21) Appl. No.: 17/535,659

(22) Filed: Nov. 25, 2021

(65) Prior Publication Data

US 2022/0168783 A1 Jun. 2, 2022

(30) Foreign Application Priority Data

Dec. 1, 2020 (JP) ................... 2020-199753

(51) Int. Cl.
*B08B 3/08* (2006.01)
*B08B 3/02* (2006.01)
*B08B 13/00* (2006.01)
*B01F 23/40* (2022.01)
*B01F 35/22* (2022.01)
*B01F 35/221* (2022.01)
*B01F 101/58* (2022.01)

(52) U.S. Cl.
CPC .............. *B08B 3/08* (2013.01); *B01F 23/405* (2022.01); *B01F 35/2202* (2022.01); *B01F 35/2217* (2022.01); *B08B 3/02* (2013.01); *B08B 13/00* (2013.01); *B01F 2101/58* (2022.01)

(58) Field of Classification Search
None
See application file for complete search history.

(56) References Cited

FOREIGN PATENT DOCUMENTS

| JP | 2016015469 | 1/2016 | |
|----|------------|--------|---|
| JP | 2018098452 | 6/2018 | |
| WO | WO-2018110631 A1 * | 6/2018 | ............... B08B 3/00 |

OTHER PUBLICATIONS

WO-2018110631 English translation, accessed on Feb. 2023. (Year: 2018).*
JP2016015469 English Translation, accessed on Feb. 2023. (Year: 2016).*

* cited by examiner

*Primary Examiner* — Eric W Golightly
*Assistant Examiner* — Arlyn I Rivera-Cordero
(74) *Attorney, Agent, or Firm* — JCIPRNET

(57) ABSTRACT

A cleaning chemical liquid supply device includes: first and second mixers respectively mixing first chemical liquid with dilution water and respectively supplying to first and second nozzles respectively supplying the first chemical liquid adjusted to desired flow rates and concentrations to a first position and a second, different position of the substrate in the cleaning device; a first dilution water control box controlling flow rates of the dilution water supplied to the first and second mixers; third and fourth mixers respectively mixing second, different chemical liquid with the dilution water and respectively supplying to third and fourth nozzles for respectively supplying the second chemical liquid adjusted to desired flow rates and concentrations to a third position and a fourth, different position of the substrate in the cleaning device; and a second dilution water control box controlling flow rates of the dilution water supplied to the third and fourth mixers.

7 Claims, 6 Drawing Sheets

CLEANING CHEMICAL LIQUID SUPPLY DEVICE AND CLEANING CHEMICAL LIQUID SUPPLY METHOD

CROSS-REFERENCE TO RELATED APPLICATION

This application claims the priority benefit of Japan application serial no. 2020-199753, filed on Dec. 1, 2020. The entirety of the above-mentioned patent application is hereby incorporated by reference herein and made a part of this specification.

BACKGROUND

Technical Field

The invention relates to a cleaning chemical liquid supply device and a cleaning chemical liquid supply method.

Description of Related Art

A chemical mechanical polishing (CMP) device has a polishing module for polishing a surface of a semiconductor substrate in which a semiconductor chip is formed and a cleaning module for supplying a chemical liquid to and cleaning the semiconductor substrate polished by the polishing module. Such cleaning module generates a chemical liquid whose concentration is adjusted by mixing a chemical liquid with dilution water, such as de-ionized water, and cleans the semiconductor substrate by using the chemical liquid.

PRIOR ART DOCUMENT

Patent Document

[Patent Document 1] Japanese Laid-open No. 2016-15469
[Patent Document 2] Japanese Laid-open No. 2018-98452

In a process of cleaning a semiconductor substrate, for a cleaning device, there are a case of using an alkaline chemical liquid and a case of using an acid chemical liquid in accordance with the pattern on a surface of the semiconductor substrate. In addition, the wiring width on a pattern surface of the semiconductor substrate has been reduced with the miniaturization of semiconductor devices, and particles with a particle diameter of 20 nm to 30 nm or less, which may not necessarily be removed in a conventional cleaning process can no longer be ignored. Here, for example, it is favorable that chemical liquids with different concentrations can be used in accordance with cleaning portions, so that, for example, a front surface of a semiconductor substrate on which a pattern is formed is cleaned by using a cleaning chemical liquid with a relatively high concentration, and a back surface on which a pattern is not formed is cleaned by using a cleaning chemical liquid with a relatively low concentration. An objective of the invention is to provide a cleaning device which, in one cleaning device, is cable of supplying different types of cleaning chemical liquids to a substrate and capable of changing concentrations and/or flow rates of chemical liquids as needed.

SUMMARY

According to an embodiment, a cleaning chemical liquid supply device for supplying a chemical liquid for cleaning a substrate to a cleaning device is provided. The cleaning chemical liquid supply device includes: a first mixer for mixing a first chemical liquid with dilution water, and supplying to a first nozzle for supplying the first chemical liquid adjusted to a desired flow rate and a desired concentration to a first position of the substrate in the cleaning device; a second mixer for mixing the first chemical liquid with the dilution water, and supplying to a second nozzle for supplying the first chemical liquid adjusted to a desired flow rate and a desired concentration to a second position of the substrate, different from the first position, in the cleaning device; a first dilution water control box for controlling flow rates of the dilution water supplied to the first mixer and the second mixer; a third mixer for mixing a second chemical liquid, different from the first chemical liquid, with the dilution water, and supplying to a third nozzle for supplying the second chemical liquid adjusted to a desired flow rate and a desired concentration to a third position of the substrate in the cleaning device; a fourth mixer for mixing the second chemical liquid with the dilution water, and supplying to a third nozzle for supplying the second chemical liquid adjusted to a desired flow rate and a desired concentration to a third position of the substrate in the cleaning device; and a second dilution water control box for controlling flow rates of the dilution water supplied to the third mixer and the fourth mixer.

According to another embodiment of the invention, a cleaning chemical liquid supply device for supplying a chemical liquid for cleaning a substrate to a cleaning method is provided. The cleaning chemical liquid supply method includes: a process of controlling flow rates of a first chemical liquid and dilution water while supplying the first chemical liquid and the dilution water to a first mixer; a process of supplying the first chemical liquid to a first position of the substrate from the first mixer; a process of controlling flow rates of the first chemical liquid and the dilution water while supplying the first chemical liquid and the dilution water to a second mixer; a process of supplying the first chemical liquid to a second position, differing from the first position, of the substrate from the second mixer; a process of controlling flow rates of a second chemical liquid and the dilution water while supplying the second chemical liquid and the dilution water to a third mixer; a process of supplying the second chemical liquid to a third position of the substrate from the third mixer; a process of controlling flow rates of the second chemical liquid and the dilution water while supplying the second chemical liquid and the dilution water to a fourth mixer; and a process of supplying the second chemical liquid to a fourth position, differing from the third position, of the substrate from the fourth mixer.

DESCRIPTION OF THE EMBODIMENTS

In the following, the embodiments of the invention will be described together with the accompanying drawings. In the accompanying drawings, like or similar elements are labeled with like or similar reference symbols, and repeated descriptions relating to like or similar elements will be omitted in the descriptions of the respective embodiments. In addition, it is possible to apply the features disclosed in the respective embodiments to other embodiments, provided that these features do not conflict each other.

Figure 1:
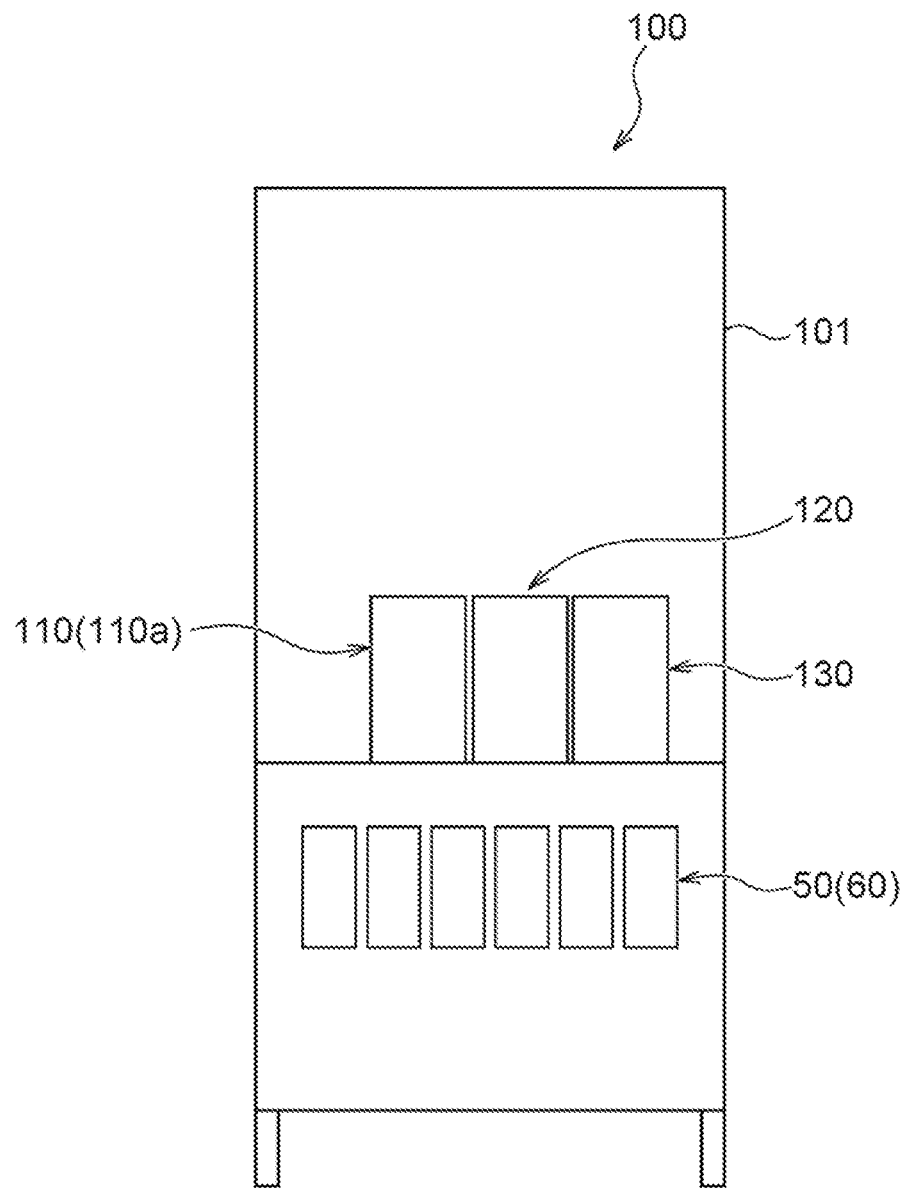
FIG. 1 is a schematic front view illustrating a cleaning chemical liquid supply device according to an embodiment.

FIG. 1 is a schematic front view illustrating a cleaning chemical liquid supply device according to an embodiment. A cleaning chemical liquid supply device 100 of the embodiment is configured to be able to supply a chemical liquid (e.g., hydrofluoric acid, ammonia) for cleaning to a cleaning device 200 having a substrate processing device. The substrate processing device, for example, includes a polishing device such as a chemical mechanical polishing (CMP) device.

As shown in FIG. 1, the cleaning chemical liquid supply device 100 according to the embodiment includes a case 101, a first dilution water control box 110, a second dilution water control box 110a, a first chemical liquid dilution box 120, a second chemical liquid dilution box 130, a first chemical liquid utility box 50, and a second chemical liquid utility box 60. The first dilution water control box 110, the second dilution water control box 110a, the first chemical liquid dilution box 120, the second chemical liquid dilution box 130, the first chemical liquid utility box 50, and the second chemical liquid utility box 60 are accommodated in the case 101.

The first chemical liquid dilution box 120 mixes a first chemical liquid with dilution water, and generates a chemical liquid (diluted chemical liquid) whose flow rate and concentration are adjusted. The second chemical liquid dilution box 130 mixes a second chemical liquid and dilution water, and generates a chemical liquid (diluted chemical liquid) whose flow rate and concentration are adjusted. The dilution water is de-ionized water (DIW) or other dilution media. In the following, the dilution water is described as DIW, the dilution water may also be a dilution medium other than DIW.

In the cleaning chemical liquid supply device 100, the first chemical liquid utility box 50 is a configuration for introducing the chemical liquid from a first chemical liquid supply source 20 into the cleaning chemical liquid supply device 100. In addition, the second chemical liquid utility box 60 is a configuration for introducing the chemical liquid from a second chemical liquid supply source 21 into the cleaning chemical liquid supply device 100. In the example shown in FIG. 1, six chemical liquid utility boxes 50 and 60 are provided in the cleaning chemical liquid supply device 100, but such configuration merely serves as an example. The numbers of the chemical liquid utility boxes 50 and 60 may be changed appropriately in accordance with the specification of the cleaning device 200. The first chemical liquid and the second chemical liquid can be chemical liquids of different kinds. For example, one of the first and second chemical liquids can be an alkaline chemical liquid, and the other can be an acid chemical liquid.

Figure 2:
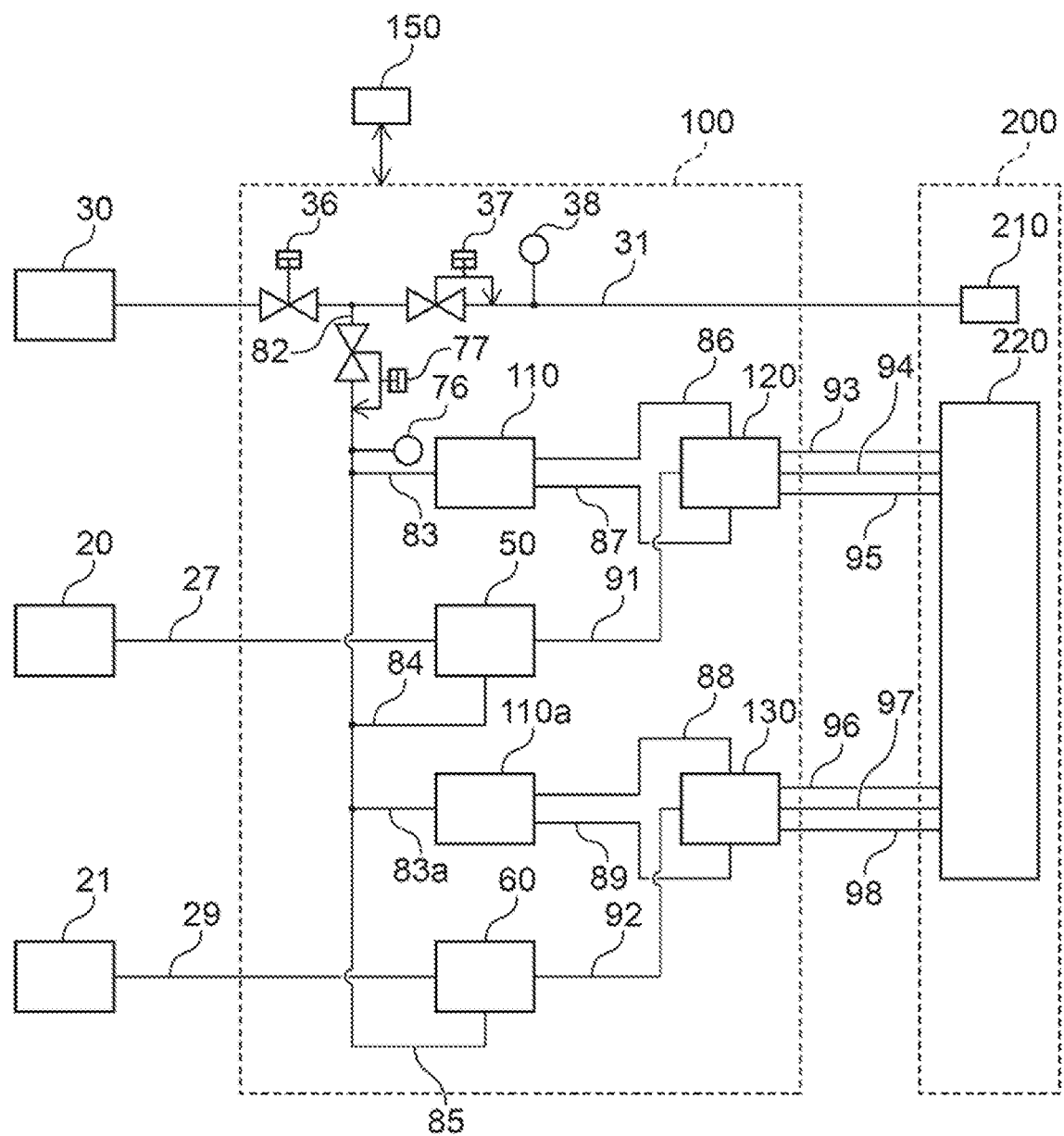
FIG. 2 is a flow circuit view of a cleaning module according to an embodiment.

FIG. 2 is a flow circuit view of a cleaning module according to an embodiment. The cleaning module includes the cleaning chemical liquid supply device 100 and the cleaning device 200. In the cleaning chemical liquid supply device 100, the first chemical liquid utility box 50 is a configuration for introducing the chemical liquid from the first chemical liquid supply source 20 into the cleaning chemical liquid supply device 100. The first chemical liquid utility box 50 is connected to a pipe 27 from the first chemical liquid supply source 20 and a pipe 84 from a DIW supply source 30. In addition, the first chemical liquid utility box 50 is connected to a pipe 91 for supplying the first chemical liquid to the first chemical liquid dilution box 120. Details of the first chemical liquid utility box 50 will be described in the following.

In the cleaning chemical liquid supply device 100, the second chemical liquid utility box 60 is a configuration for introducing the chemical liquid from the second chemical liquid supply source 21 into the cleaning chemical liquid supply device 100. The second chemical liquid utility box 60 is connected to a pipe 29 from the second chemical liquid supply source 21 and a pipe 85 from the DIW supply source 30. In addition, the second chemical liquid utility box 60 is connected to a pipe 92 for supplying the second chemical liquid to the second chemical liquid dilution box 130. Details of the second chemical liquid utility box 60 will be described in the following.

In the cleaning chemical liquid supply device 100, the first dilution water control box 110 is connected to a pipe 83 from the DIW supply source 30. In addition, the first dilution water control box 110 is connected to pipes 86 and 87 for supplying dilution water to the first chemical liquid dilution box 120. Details of the first dilution water control box 110 will be described in the following.

In the cleaning chemical liquid supply device 100, the second dilution water control box 110a is a configuration for supplying dilution water to the second chemical liquid dilution box 130. The second dilution water control box 110a is connected to a pipe 83a from the DIW supply source 30. In addition, the second dilution water control box 110a is connected to pipes 88 and 89 for supplying dilution water to the second chemical liquid dilution box 130. Details of the second dilution water control box 110a will be described in the following.

The chemical liquid supply device 100 includes a DIW supply pipe 31. One end of the DIW supply pipe 31 is connected to the DIW supply source 30, and the other end is connected to a DIW cleaning part 210 of the cleaning device 200. The DIW supply pipe 31 is provided with a DIW supply valve 36, a DIW pressure regulation regulator 37, and a DIW pressure gauge 38. The DIW supply valve 36 controls the supply of DIW from the DIW supply source 30 to the DIW supply pipe 31 by being opened and closed. The DIW pressure regulation regulator 37 regulates the supply pressure of DIW from the DIW supply pipe 31 to the DIW cleaning part 210. The DIW Pressure gauge 38 measures the pressure of DIW passing through the inside of the DIW supply pipe 31.

A branch pipe 82 connected to the pipe 83 to the first dilution water control box 110, the pipe 83a to the second dilution water control box 110a, the pipe 84 to the first chemical liquid utility box 50, and the pipe 85 to the second chemical liquid utility box 60 are connected between the DIW supply valve 36 and the DIW pressure regulation regulator 37 on the DIW supply pipe 31. The branch pipe 82 is provided with a DIW pressure regulation regulator 77 and a DIW pressure gauge 76. The DIW pressure regulation regulator 77 regulates the supply pressure of DIW from the branch pipe 82 to each part of the first dilution water control box 110, the second dilution water control box 110a, the first chemical liquid utility box 50, and the second chemical liquid utility box 60. The DIW pressure gauge 76 measures the pressure of DIW passing through the inside of the branch pipe 82.

In the cleaning chemical liquid supply device 100, the first chemical liquid dilution box 120 is a configuration for supplying the diluted first chemical liquid to a chemical liquid cleaning tank 220 of the cleaning device 200. The first chemical liquid dilution box 120 is connected to the pipe 91 from the first chemical liquid utility box 50 and the pipes 86 and 87 from the first dilution water control box 110. In addition, the first chemical liquid dilution box 120 is connected to pipes 93, 94, and 95 for supplying the diluted first chemical liquid to the chemical liquid cleaning tank 220. The first chemical liquid dilution box 120 is configured to be able to dilute the first chemical liquid to at least two different concentrations and supply the first chemical liquids of different concentrations to the chemical liquid cleaning tank 220. Details of the first chemical liquid dilution box 120 will be described in the following.

In the cleaning chemical liquid supply device 100, the second chemical liquid dilution box 130 is a configuration for supplying the diluted second chemical liquid to the chemical liquid cleaning tank 220 of the cleaning device 200. The second chemical liquid dilution box 130 is connected to the pipe 92 from the second chemical liquid utility box 60 and the pipes 88 and 89 from the second dilution water control box 110. In addition, the second chemical liquid dilution box 130 is connected to pipes 96, 97, and 98 for supplying the diluted second chemical liquid to the chemical liquid cleaning tank 220. The second chemical liquid dilution box 130 is configured to be able to dilute the second chemical liquid to at least two different concentrations and supply the second chemical liquids of different concentrations to the chemical liquid cleaning tank 220. Details of the second chemical liquid dilution box 130 will be described in the following.

Figure 3:
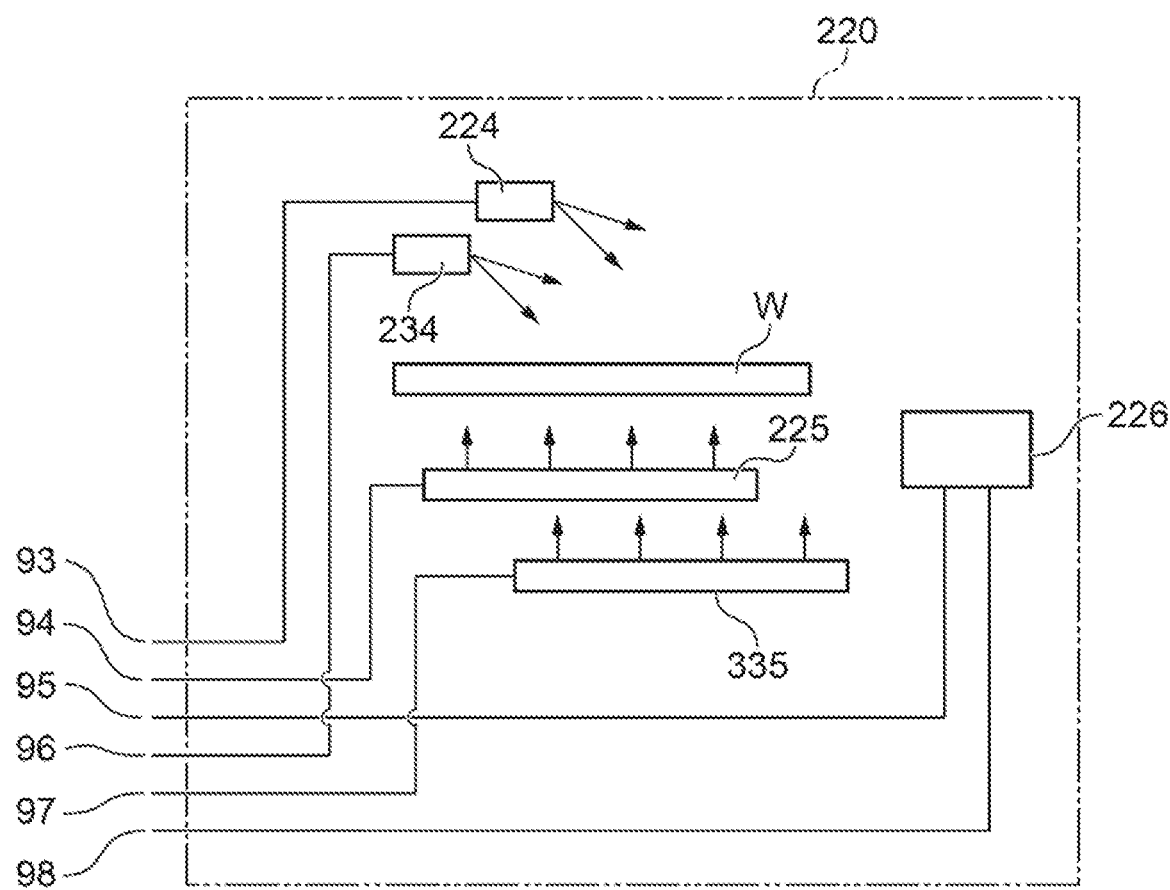
FIG. 3 is a schematic view illustrating a chemical liquid cleaning tank of a cleaning device according to an embodiment.

FIG. 3 is a schematic view illustrating the chemical liquid cleaning tank 220 of the cleaning device 200 according to an embodiment. The cleaning device 200 is a device provided in a substrate processing device, such as a polishing device, and cleaning a substrate W. The chemical liquid cleaning tank 220 is a tank for cleaning the substrate W by using a chemical liquid in the cleaning device 200. In the embodiment shown in FIG. 3, the substrate W is held in the chemical liquid cleaning tank 220 by using a substrate holding mechanism (not shown). The substrate holding mechanism may support only the outer peripheral part of the substrate W, for example, and hold the substrate W so that the upper surface and the lower surface of the substrate W are substantially entirely exposed. In addition, the substrate holding mechanism may be able to hold the substrate W to be rotatable. Any conventional substrate holding mechanism can be adopted as the substrate holding mechanism in the chemical liquid cleaning tank 220.

As shown in FIG. 3, the chemical liquid cleaning tank 220 includes a first upper nozzle 224 and a second upper nozzle 234 provided on the upper surface side of the substrate W. The first upper nozzle 224 and the second upper nozzle 234 are provided above the substrate W and respectively spray the diluted first chemical liquid and second chemical liquid toward the upper surface of the substrate W. As shown in the figure, the first upper nozzle 224 is connected to the pipe 93 from the first chemical liquid dilution box 120. Therefore, the first upper nozzle 224 can supply the first chemical liquid adjusted to a desired flow rate and concentration at the first chemical liquid dilution box 120 to the upper surface of the substrate W. In addition, as shown in the figure, the second upper nozzle 234 is connected to the pipe 96 from the second chemical liquid dilution box 130. Therefore, the second upper nozzle 234 can supply the second chemical liquid adjusted to a desired flow rate and concentration at the second chemical liquid dilution box 130 to the upper surface of the substrate W. In order to reduce pressure loss on the flow passage, nozzles of a low pressure loss type (e.g., one with a flat type ejection port) may be used as the first upper nozzle 224 and the second upper nozzle 234. By supplying the chemical liquid by the first upper nozzle 224 or the second upper nozzle 234 to the vicinity of the center of the substrate W while the substrate W rotates, the chemical liquid supplied to the upper surface of the substrate W can spread on the substrate W due to centrifugal force and clean the entire upper surface of the substrate W.

In an embodiment, the first upper nozzle 224 and the second upper nozzle 234 can be configured to be able to change nozzle orientations. With the nozzle orientations being changeable, the chemical liquids can be supplied to any position on the upper surface of the substrate W. In addition, in an embodiment, the first upper nozzle 224 and the second upper nozzle 234 may be configured to be movable. With the nozzles being movable, the chemical liquids can be supplied to any position on the upper surface of the substrate W.

In the above embodiment, in the chemical liquid cleaning tank 220, chemical liquids of different types can be supplied to the upper surface of the substrate W to clean the substrate W. In the substrate processing device, there is case where it is necessary to use different types of chemical liquids to clean the substrate in a substrate processing process. In such case as well, the same cleaning device 200 and chemical liquid cleaning tank 220 can be used to clean the substrate W.

As shown in FIG. 3, the chemical liquid cleaning tank 220 includes a first lower nozzle 225 and a second lower nozzle 235 provided on the lower surface side of the substrate W. The first lower nozzle 225 and the second lower nozzle 235 are provided below the substrate W and respectively spray the diluted first chemical liquid and second chemical liquid toward the lower surface of the substrate W. As shown in the figure, the first lower nozzle 225 is connected to the pipe 94 from the first chemical liquid dilution box 120. Therefore, the first lower nozzle 225 can supply the first chemical liquid adjusted to a desired flow rate and concentration at the first chemical liquid dilution box 120 to the lower surface of the substrate W. In addition, as shown in the figure, the second lower nozzle 235 is connected to the pipe 97 from the second chemical liquid dilution box 130. Therefore, the second lower nozzle 235 can supply the second chemical liquid adjusted to a desired flow rate and concentration at the second chemical liquid dilution box 130 to the lower surface of the substrate W. The first lower nozzle 225 and the second lower nozzle 235 have a configuration in which multiple nozzle holes are provided in an elongated cylindrical housing, for example. The cylindrical housing has a longitudinal dimension approximately equal to the diameter of the substrate W. By applying the chemical liquid from the first lower nozzle 225 or the second lower nozzle 235 to the lower surface of the substrate W, the entire lower surface of the substrate W can be cleaned.

In an embodiment, the first lower nozzle 225 and the second lower nozzle 235 can be configured to be able to change nozzle orientations. With the nozzle orientations being changeable, the chemical liquids can be supplied to any position on the lower surface of the substrate W. In addition, in an embodiment, the first lower nozzle 225 and the second lower nozzle 235 may be configured to be movable. With the nozzles being movable, the chemical liquids can be supplied to any position on the lower surface of the substrate W. In order to reduce pressure loss on the flow passage, nozzles of a low pressure loss type may be used as the first lower nozzle 225 and the second lower nozzle 235.

In an embodiment, the chemical liquid cleaning tank 220 includes a waiting part 226, as shown in FIG. 3. A substrate waiting to be cleaned by the cleaning device 200 can be provided in the waiting part 226. As shown in FIG. 3, the waiting part 226 is connected to the pipe 95 from the first chemical liquid dilution box 120 and the second chemical liquid dilution box 130. Therefore, the waiting part 226 can supply the first chemical liquid adjusted to the desired flow rate and concentration at the first chemical liquid dilution box 120 and the second chemical liquid adjusted to the desired flow rate and concentration at the second chemical liquid dilution box 130 with respect to the substrate that is waiting. In addition, in the chemical liquid cleaning tank 220, when the substrate W is not being cleaned by using the upper nozzles 224 and 234 and the lower nozzles 225 and 235, by supplying chemical liquids to the waiting part 226, the pipe 91 from the first chemical liquid utility box 50 to the first chemical liquid dilution box 120 and the pipe 92 from the second chemical liquid utility box 60 to the second chemical liquid dilution box 130 can be flushed.

Figure 4:
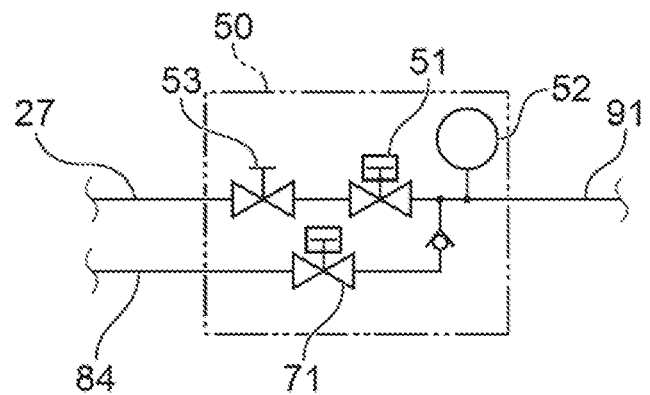
FIG. 4 is a view illustrating a first chemical liquid utility box according to an embodiment.

FIG. 4 is a view illustrating the first chemical liquid utility box 50 according to an embodiment. As shown in FIG. 4, the first chemical liquid utility box 50 is connected to the pipe 27 from the first chemical liquid supply source 20. As shown in FIG. 4, the first chemical liquid utility box 50 includes a lockout valve 53, a chemical liquid opening/closing valve 51, and a pressure gauge 52. In addition, the first chemical liquid utility box 50 includes a flushing opening/closing valve 71 provided at the pipe 84 from the DIW supply source 30. The pipe 84 from the DIW supply source 30 is connected between the opening/closing valve 51 and the pressure gauge 52 via the flushing opening/closing valve 71. The opening/closing valves 51 and 71 are controlled to open or close according to a signal from the control device 150. In addition, the opening/closing valves 51 and 71, as well as other opening/closing valves described in the specification, can be ones driven pneumatically or electromagnetically. In the embodiment of the drawings, by supplying DIW downstream via the flushing opening/closing valve 71, pipe cleaning can be performed. For example, in the case where a standby state in which a chemical liquid for cleaning the substrate is not supplied continues, the chemical liquid remaining in the pipes becomes deteriorated. Therefore, by periodically cleaning the pipes in the standby, at the time when the cleaning process of the substrate resumes, a new chemical liquid can be supplied. The lockout valve 53 is a valve opened or closed manually. For example, the lockout valve 53 is used at the time when the first chemical liquid supply source 20 is disconnected from the cleaning chemical liquid supply device 100 during maintenance. The pressure gauge 52 detects the pressure of the chemical liquid introduced from the first chemical liquid supply source 20 into the cleaning chemical liquid supply device 100. The first chemical liquid utility box 50 is connected to the pipe 91 for supplying the first chemical liquid to the first chemical liquid dilution box 120.

Figure 5:
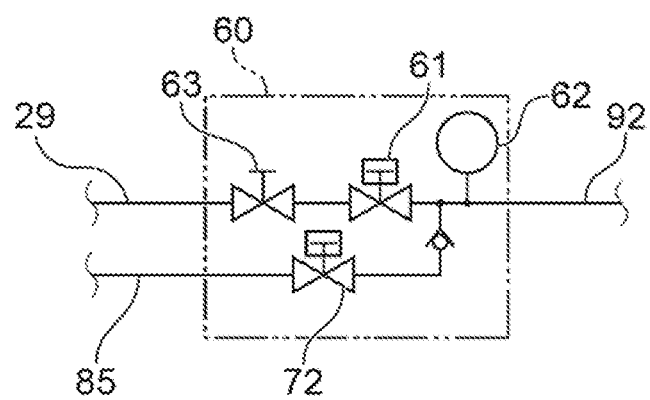
FIG. 5 is a view illustrating a second chemical liquid utility box according to an embodiment.

FIG. 5 is a view illustrating the second chemical liquid utility box 60 according to an embodiment. As shown in FIG. 5, the second chemical liquid utility box 60 is connected to the pipe 29 from the second chemical liquid supply source 21. As shown in FIG. 5, the second chemical liquid utility box 60 includes a lockout valve 63, a chemical liquid opening/closing valve 61, and a pressure gauge 62. In addition, the second chemical liquid utility box 60 includes a flushing opening/closing valve 72 provided at the pipe 85 from the DIW supply source 30. The pipe 85 from the DIW supply source 30 is connected between the opening/closing valve 61 and the pressure gauge 62 via the flushing opening/closing valve 72. The opening/closing valves 61 and 72 are controlled to open or close according to a signal from the control device 150. In the embodiment of the drawings, by supplying DIW downstream via the flushing opening/closing valve 72, pipe cleaning can be performed. For example, in the case where a standby state in which a chemical liquid for cleaning the substrate is not supplied continues, the chemical liquid remaining in the pipes becomes deteriorated. Therefore, by periodically cleaning the pipes in the standby, at the time when the cleaning process of the substrate resumes, a new chemical liquid can be supplied. The lockout valve 63 is a valve opened or closed manually. For example, the lockout valve 53 is used at the time when the second chemical liquid supply source 21 is disconnected from the cleaning chemical liquid supply device 100 during maintenance. The pressure gauge 62 detects the pressure of the chemical liquid introduced from the second chemical liquid supply source 21 into the cleaning chemical liquid supply device 100. The second chemical liquid utility box 60 is connected to the pipe 92 for supplying the second chemical liquid to the second chemical liquid dilution box 130.

Figure 6:
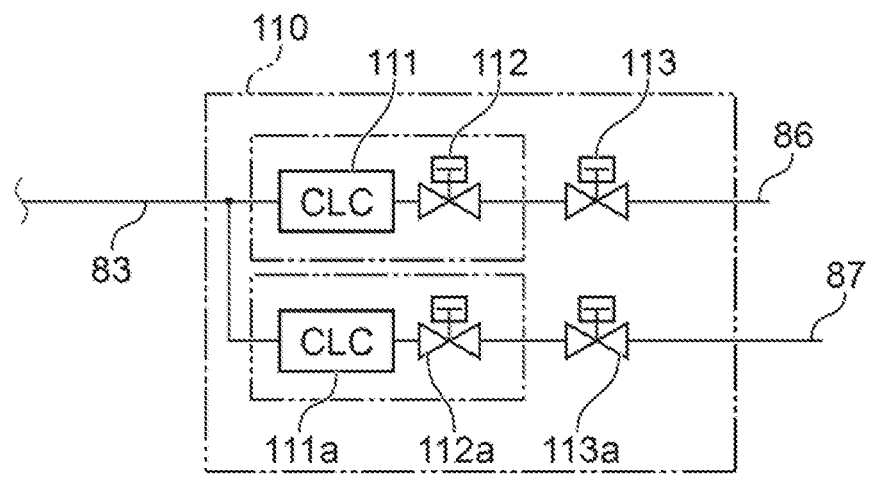
FIG. 6 is a view illustrating a first dilution water control box according to an embodiment.

FIG. 6 is a view illustrating the first dilution water control box 110 according to an embodiment. As shown in FIG. 2, the first dilution water control box 110 is connected to the pipe 83 from the DIW supply source 30. Inside the first dilution water control box 110, the pipe 83 is branched into two.

As shown in FIG. 6, a first dilution water closed loop controller (CLC) 111 and a dilution water supply valve 113 are connected to the pipe of one of the branches from the pipe 83, and are connected to the pipe 86 to the first chemical liquid dilution box 120. The first dilution water CLC 111 adjusts the flow rates of the dilution water supplied to the dilution water supply valve 113 and the first chemical liquid dilution box 120. In addition, the first dilution water CLC 111 includes a flowmeter measuring the flow rate of the dilution water flowing to the first dilution water CLC 111. The first dilution water CLC 111, based on the measurement result, modulates (feedback control) the opening degree of an internal control valve 112 of the first dilution water CLC 111, so that the flow rate of the dilution water flowing in the first dilution water CLC 111 becomes a desired flow rate.

As shown in FIG. 6, a second dilution water closed loop controller (CLC) 111a and a dilution water supply valve 113a are connected to the pipe of the other of the branches from the pipe 83, and are connected to the pipe 87 to the first chemical liquid dilution box 120. The second dilution water CLC 111a adjusts the flow rates of the dilution water supplied to the dilution water supply valve 113a and the first chemical liquid dilution box 120. In addition, the second dilution water CLC 111a includes a flowmeter measuring the flow rate of the dilution water flowing to the second dilution water CLC 111*a*. The second dilution water CLC 111*a*, based on the measurement result, modulates (feedback control) the opening degree of an internal control valve 112*a* of the second dilution water CLC 111*a*, so that the flow rate of the dilution water flowing in the second dilution water CLC 111*a* becomes a desired flow rate.

Figure 7:
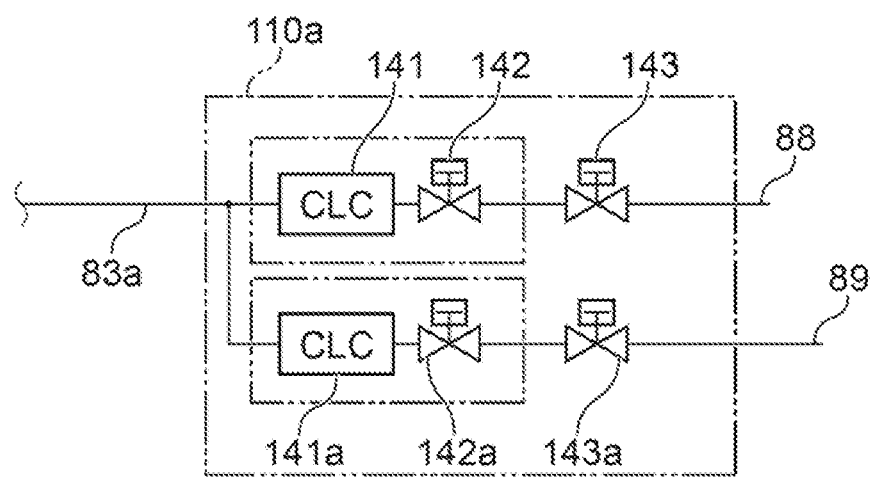
FIG. 7 is a view illustrating a second dilution water control box according to an embodiment.

FIG. 7 is a view illustrating the second dilution water control box 110*a* according to an embodiment. As shown in FIG. 2, the second dilution water control box 110*a* is connected to the pipe 83*a* from the DIW supply source 30. Inside the second dilution water control box 110*a*, the pipe 83 is branched into two.

As shown in FIG. 7, a third dilution water closed loop controller (CLC) 141 and a dilution water supply valve 143 are connected to the pipe of one of the branches from the pipe 83*a*, and are connected to the pipe 88 to the second chemical liquid dilution box 130. The third dilution water CLC 141 adjusts the flow rates of the dilution water supplied to the dilution water supply valve 143 and the second chemical liquid dilution box 130. In addition, the third dilution water CLC 141 includes a flowmeter measuring the flow rate of the dilution water flowing to the third dilution water CLC 141. The third dilution water CLC 141, based on the measurement result, modulates (feedback control) the opening degree of an internal control valve 142 of the third dilution water CLC 141, so that the flow rate of the dilution water flowing in the third dilution water CLC 141 becomes a desired flow rate.

As shown in FIG. 7, a fourth dilution water closed loop controller (CLC) 141*a* and a dilution water supply valve 143*a* are connected to the pipe of the other of the branches from the pipe 83*a*, and are connected to the pipe 89 to the second chemical liquid dilution box 130. The fourth dilution water CLC 141*a* adjusts the flow rates of the dilution water supplied to the dilution water supply valve 143*a* and the second chemical liquid dilution box 130. In addition, the fourth dilution water CLC 141*a* includes a flowmeter measuring the flow rate of the dilution water flowing to the fourth dilution water CLC 141*a*. The fourth dilution water CLC 141*a*, based on the measurement result, modulates (feedback control) the opening degree of an internal control valve 142*a* of the fourth dilution water CLC 141, so that the flow rate of the dilution water flowing in the fourth dilution water CLC 141*a* becomes a desired flow rate.

Figure 8:
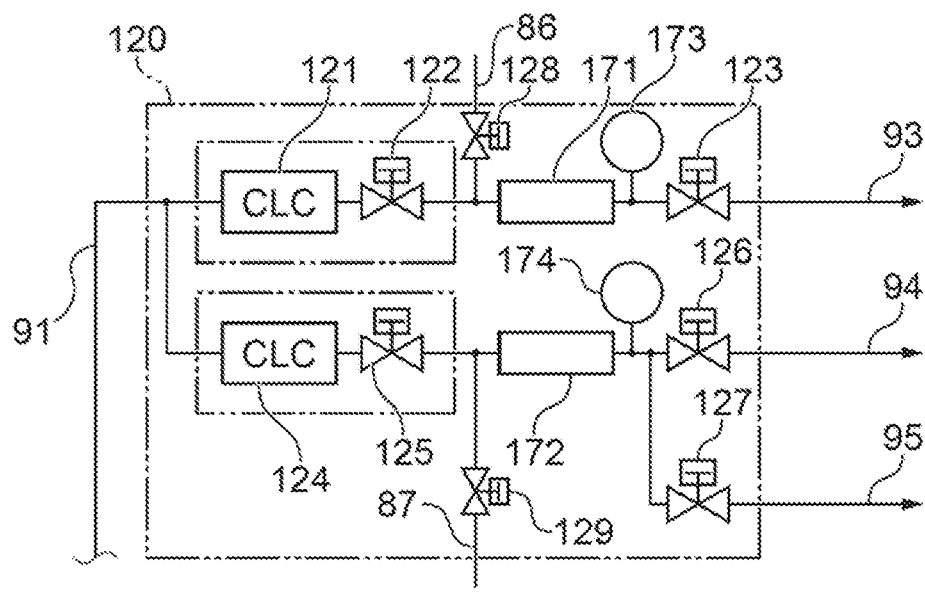
FIG. 8 is a view illustrating a first chemical liquid dilution box according to an embodiment.

FIG. 8 is a view illustrating the first chemical liquid dilution box 120 according to an embodiment. The first chemical liquid dilution box 120 controls the flow rate of the chemical liquid, mixes the dilution water whose flow rate is controlled with the chemical liquid, and supplies chemical liquids with desired flow rates and concentrations to the pipes 93, 94, 95 to the cleaning device 200. As shown in FIG. 2, the first chemical liquid dilution box 120 is connected to the pipe 91 from the first chemical liquid utility box 50. Inside the first chemical liquid dilution box 120, the pipe 91 is branched into two.

As shown in FIG. 8, a first chemical liquid closed loop controller (CLC) 121, a first mixer 171, a pressure gauge 173, and a chemical liquid valve 123 are connected to the pipe of one of the branches from the pipe 91, and are connected to the pipe 93 to the chemical liquid cleaning tank 220. The first chemical liquid CLC 121 adjusts the flow rate of the first chemical liquid supplied to the first mixer 171. In addition, the first chemical liquid CLC 121 includes a flowmeter measuring the flow rate of the chemical liquid flowing to the first chemical liquid CLC 121. The first chemical liquid CLC 121, based on the measurement result, modulates (feedback control) the opening degree of an internal control valve 122 of the first chemical liquid CLC 121, so that the flow rate of the chemical liquid flowing in the first chemical liquid CLC 121 becomes a desired flow rate. In the first chemical liquid dilution box 120, the pipe 86 from the first dilution water control box 110 is connected between the first chemical liquid CLC 121 and the first mixer 171 via an opening/closing valve 128. The first chemical liquid adjusted to the desired flow rate and concentration by the first chemical liquid CLC 121 and the dilution water adjusted to the desired flow rate and concentration by the first dilution water CLC 111 of the first dilution water control box 110 are supplied to the first mixer 171. Therefore, the first mixer 171 can generate a chemical liquid with the desired concentration. The chemical liquid adjusted to the desired concentration by the first mixer 171 can be supplied to the upper surface of the substrate W from the first upper nozzle 224 provided in the chemical liquid cleaning tank 220.

As shown in FIG. 8, a second chemical liquid closed loop controller (CLC) 124, a second mixer 172, a pressure gauge 174, and chemical liquid valves 126, 127 are connected to the pipe of the other of the branches from the pipe 91, and are connected to the pipes 94, 95 to the chemical liquid cleaning tank 220. The second chemical liquid CLC 124 adjusts the flow rate of the first chemical liquid supplied to the second mixer 172. In addition, the second chemical liquid CLC 124 includes a flowmeter measuring the flow rate of the chemical liquid flowing to the second chemical liquid CLC 124. The second chemical liquid CLC 124, based on the measurement result, modulates (feedback control) the opening degree of an internal control valve 125 of the second chemical liquid CLC 124, so that the flow rate of the chemical liquid flowing in the second chemical liquid CLC 124 becomes a desired flow rate. In the first chemical liquid dilution box 120, the pipe 87 from the first dilution water control box 110 is connected between the second chemical liquid CLC 124 and the second mixer 172 via an opening/closing valve 129. The first chemical liquid adjusted to the desired flow rate and concentration by the second chemical liquid CLC 124 and the dilution water adjusted to the desired flow rate and concentration by the second dilution water CLC 111*a* of the first dilution water control box 110 are supplied to the second mixer 172. Therefore, the second mixer 172 can generate a chemical liquid with the desired concentration. The chemical liquid adjusted to the desired concentration by the second mixer 172 can be supplied to the lower surface of the substrate W from the first lower nozzle 225 provided in the chemical liquid cleaning tank 220. In addition, as shown in FIG. 8, a branch path is provided downstream of the second mixer 172, and can supply the chemical liquid to the waiting part 226 of the chemical liquid cleaning tank 220 via the chemical liquid valve 127.

Figure 9:
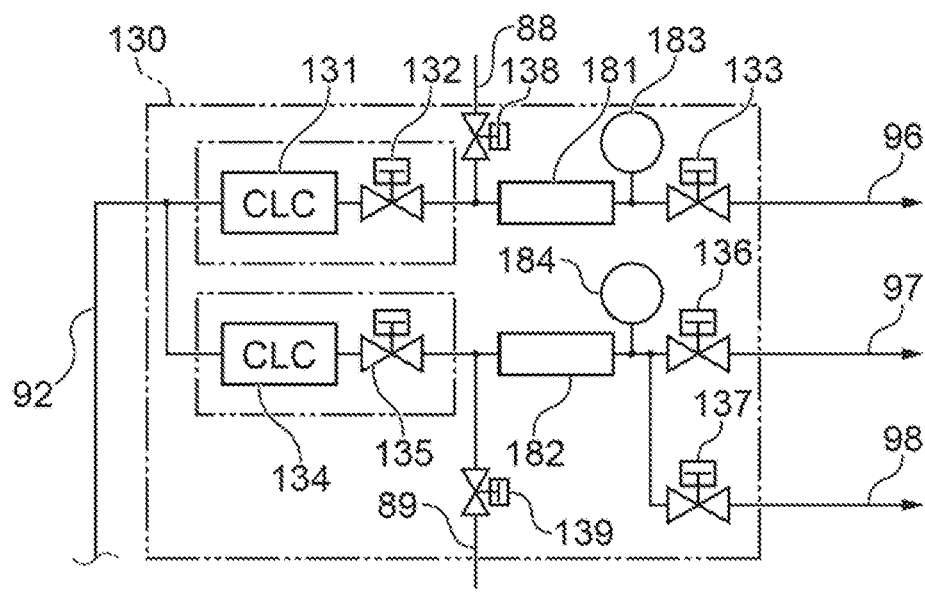
FIG. 9 is a view illustrating a second chemical liquid dilution box according to an embodiment.

FIG. 9 is a view illustrating the second chemical liquid dilution box 130 according to an embodiment. The second chemical liquid dilution box 130 controls the flow rate of the chemical liquid, mixes the dilution water whose flow rate is controlled with the chemical liquid, and outputs chemical liquids with desired flow rates and concentrations to the pipes 96, 97, 98 to the cleaning device 200. As shown in FIG. 2, the second chemical liquid dilution box 130 is connected to the pipe 92 from the second chemical liquid utility box 60. Inside the second chemical liquid dilution box 130, the pipe 91 is branched into two.

As shown in FIG. 9, a third chemical liquid closed loop controller (CLC) 131, a third mixer 181, a pressure gauge 183, and a chemical liquid valve 133 are connected to the pipe of one of the branches from the pipe 92, and are connected to the pipe 96 to the chemical liquid cleaning tank 220. The third chemical liquid CLC 131 adjusts the flow rate of the second chemical liquid supplied to the third mixer 181. In addition, the third chemical liquid CLC 131 includes a flowmeter measuring the flow rate of the chemical liquid flowing to the third chemical liquid CLC 131. The third chemical liquid CLC 131, based on the measurement result, modulates (feedback control) the opening degree of an internal control valve 132 of the third chemical liquid CLC 131, so that the flow rate of the chemical liquid flowing in the third chemical liquid CLC 131 becomes a desired flow rate. In the second chemical liquid dilution box 130, the pipe 88 from the second dilution water control box 110a is connected between the third chemical liquid CLC 131 and the third mixer 181 via an opening/closing valve 138. The second chemical liquid adjusted to the desired flow rate and concentration by the third chemical liquid CLC 131 and the dilution water adjusted to the desired flow rate and concentration by the third dilution water CLC 141 of the second dilution water control box 110a are supplied to the third mixer 181. Therefore, the third mixer 181 can generate a chemical liquid with the desired concentration. The chemical liquid adjusted to the desired concentration by the third mixer 181 can be supplied to the upper surface of the substrate W from the second upper nozzle 234 provided in the chemical liquid cleaning tank 220.

As shown in FIG. 9, a fourth chemical liquid closed loop controller (CLC) 134, a fourth mixer 182, a pressure gauge 184, and chemical liquid valves 136, 137 are connected to the pipe of the other of the branches from the pipe 92, and are connected to the pipes 97, 98 to the chemical liquid cleaning tank 220. The fourth chemical liquid CLC 134 adjusts the flow rate of the second chemical liquid supplied to the fourth mixer 182. In addition, the fourth chemical liquid CLC 134 includes a flowmeter measuring the flow rate of the chemical liquid flowing to the fourth chemical liquid CLC 134. The fourth chemical liquid CLC 134, based on the measurement result, modulates (feedback control) the opening degree of an internal control valve 135 of the fourth chemical liquid CLC 134, so that the flow rate of the chemical liquid flowing in the fourth chemical liquid CLC 134 becomes a desired flow rate. In the second chemical liquid dilution box 130, the pipe 89 from the second dilution water control box 110a is connected between the fourth chemical liquid CLC 134 and the fourth mixer 182 via an opening/closing valve 139. The second chemical liquid adjusted to the desired flow rate and concentration by the fourth chemical liquid CLC 134 and the dilution water adjusted to the desired flow rate and concentration by the fourth dilution water CLC 141a of the second dilution water control box 110a are supplied to the fourth mixer 182. Therefore, the fourth mixer 182 can generate a chemical liquid with the desired concentration. The chemical liquid adjusted to the desired concentration by the fourth mixer 182 can be supplied to the lower surface of the substrate W from the second lower nozzle 235 provided in the chemical liquid cleaning tank 220. In addition, as shown in FIG. 9, a branch path is provided downstream of the fourth mixer 182, and can supply the chemical liquid to the waiting part 226 of the chemical liquid cleaning tank 220 via the chemical liquid valve 137.

The control device 150 (see FIG. 2), for example, may be a control device provided with respect to the cleaning chemical liquid supply device 100, may be a control device provided with respect to the cleaning module, and may also be a control device provided with respect to the substrate processing device such as a polishing device provided with the cleaning module. The control device 150 includes a computer or a control circuit such as a microcomputer and a sequencer, and a recording medium (volatile, non-volatile memories, etc.) storing a program executed by the control circuit. The program includes a program carrying out supply of the chemical liquid (diluted chemical liquid) as well as cleaning by the cleaning chemical liquid supply device 100 and the cleaning device 200. The respective parts of the cleaning chemical liquid supply device 100 and the cleaning device 200 are controlled according to the program. The program may also be stored in a recording medium (CD, flash memory, etc.) attachable/detachable to/from the control device 150. Moreover, the control device 150 may also be stored in a recording medium readable in a wired or wireless manner.

In the above embodiment, in the chemical liquid cleaning tank 220, different types of chemical liquids of the first chemical liquid and the second chemical liquid can be supplied to the substrate to clean the substrate. A type of the chemical liquid suitable for the pattern of the front surface of the substrate or suitable for the process just applied to the substrate can be selected to clean the substrate. For example, one of the first chemical liquid and the second chemical liquid can be an alkaline chemical liquid, and the other can be an acid chemical liquid.

In addition, in the above embodiment, chemical liquids with different concentrations can be supplied to the upper surface and the lower surface of the substrate. For example, a chemical liquid with a higher concentration can be supplied to the front surface of the substrate, and a chemical liquid with a lower concentration can be supplied to the back surface of the substrate, thereby cleaning the entire substrate. In addition, in the above embodiment, the flow rate of the chemical liquid supplied to the substrate can be controlled arbitrarily. For example, it may also be that a chemical liquid with a higher flow rate is supplied to the front surface of the substrate, and a chemical liquid with a lower flow rate is supplied to the back surface of the substrate. Moreover, when the substrate is being cleaned, the concentration and/or the flow rate of the chemical liquid can also be changed. For example, it may also be controlled that at an initial stage of the cleaning, the concentration and/or the flow rate of the chemical liquid is higher, and, as the cleaning proceeds, the concentration and/or the flow rate of the chemical liquid is decreased.

Although the cleaning chemical liquid supply device 100 is configured to supply the cleaning chemical liquid to one cleaning device 200 in the embodiment shown herein, the cleaning chemical liquid supply device 100 according to other embodiments may also be configured to supply chemical liquids to two or more cleaning devices 200. In the case where chemical liquids are supplied to multiple cleaning devices 200, configurations equivalent to the first chemical liquid utility box 50, the second chemical liquid utility box 60, the first chemical liquid dilution box 120, and the second chemical liquid dilution box 130 are respectively provided in correspondence with the number of the cleaning devices 200, the first dilution water control box 110 and the second dilution water control box 110a are provided with branch paths, and a configuration in which the dilution water is supplied to the configurations respectively equivalent to the first chemical liquid dilution box 120 and the second chemical liquid dilution box 130 can be arranged.

Although the embodiments of the invention have been described above based on some examples, the embodiments of the invention are for facilitating the understanding of the invention and do not limit the invention. The invention can be modified and improved without departing from the spirit thereof, and it goes without saying that the present invention includes an equivalent thereof. In addition, within the range where at least a part of the above-mentioned issues can be solved, or at least a part of the effect can be achieved, any combination or omission of each component described in the claims and the specification is possible.

At least the following technical ideas are grasped from the above-described embodiment.

According to an aspect of the invention, a cleaning chemical liquid supply device for supplying a chemical liquid for cleaning a substrate to a cleaning device is provided. The cleaning chemical liquid supply device includes: a first mixer for mixing a first chemical liquid with dilution water, and supplying to a first nozzle for supplying the first chemical liquid adjusted to a desired flow rate and a desired concentration to a first position of the substrate in the cleaning device; a second mixer for mixing the first chemical liquid with the dilution water, and supplying to a second nozzle for supplying the first chemical liquid adjusted to a desired flow rate and a desired concentration to a second position of the substrate, different from the first position, in the cleaning device; a first dilution water control box for controlling flow rates of the dilution water supplied to the first mixer and the second mixer; a third mixer for mixing a second chemical liquid, different from the first chemical liquid, with the dilution water, and supplying to a third nozzle for supplying the second chemical liquid adjusted to a desired flow rate and a desired concentration to a third position of the substrate in the cleaning device; a fourth mixer for mixing the second chemical liquid with the dilution water, and supplying to a third nozzle for supplying the second chemical liquid adjusted to a desired flow rate and a desired concentration to a third position of the substrate in the cleaning device; and a second dilution water control box for controlling flow rates of the dilution water supplied to the third mixer and the fourth mixer.

According to an embodiment of the invention, in the cleaning chemical liquid supply device, the first nozzle is provided to supply the first chemical liquid to an upper surface of the substrate, the second nozzle is provided to supply the first chemical liquid to a lower surface of the substrate, the third nozzle is provided to supply the second chemical liquid to the upper surface of the substrate, and the fourth nozzle is provided to supply the second chemical liquid to the lower surface of the substrate, According to an embodiment of the invention, the cleaning chemical liquid supply device includes: a first chemical liquid closed loop controller for controlling a flow rate of the first chemical liquid supplied to the first mixer; a first dilution water closed loop controller for controlling a flow rate of the dilution water supplied to the first mixer, a second chemical liquid closed loop controller for controlling a flow rate of the first chemical liquid supplied to the second mixer; a second dilution water closed loop controller for controlling a flow rate of the dilution water supplied to the second mixer, a third chemical liquid closed loop controller for controlling a flow rate of the second chemical liquid supplied to the third mixer; a third dilution water closed loop controller for controlling a flow rate of the dilution water supplied to the third mixer, a fourth chemical liquid closed loop controller for controlling a flow rate of the second chemical liquid supplied to the fourth mixer; and a fourth dilution water closed loop controller for controlling a flow rate of the dilution water supplied to the fourth mixer.

According to an embodiment of the invention, in the cleaning chemical liquid supply device, one of the first chemical liquid and the second chemical liquid is an alkaline chemical liquid, and the other is an acid chemical liquid.

According to another aspect of the invention, a cleaning chemical liquid supply device for supplying a chemical liquid for cleaning a substrate to a cleaning method is provided. The cleaning chemical liquid supply method includes: a process of controlling flow rates of a first chemical liquid and dilution water while supplying the first chemical liquid and the dilution water to a first mixer; a process of supplying the first chemical liquid to a first position of the substrate from the first mixer; a process of controlling flow rates of the first chemical liquid and the dilution water while supplying the first chemical liquid and the dilution water to a second mixer; a process of supplying the first chemical liquid to a second position, differing from the first position, of the substrate from the second mixer; a process of controlling flow rates of a second chemical liquid and the dilution water while supplying the second chemical liquid and the dilution water to a third mixer; a process of supplying the second chemical liquid to a third position of the substrate from the third mixer; a process of controlling flow rates of the second chemical liquid and the dilution water while supplying the second chemical liquid and the dilution water to a fourth mixer; and a process of supplying the second chemical liquid to a fourth position, differing from the third position, of the substrate from the fourth mixer.

According to an embodiment of the invention, in the cleaning chemical liquid supply method, the first position of the substrate is on an upper surface of the substrate, the second position of the substrate is on an lower surface of the substrate, the third position of the substrate is on the upper surface of the substrate, and the fourth position of the substrate is on the lower surface of the substrate.

According to an embodiment of the invention, in the cleaning chemical liquid supply method, control of the flow rates of the first chemical liquid and the dilution water to the first mixer includes performing feedback control based on the respective flow rates of the first chemical liquid and the dilution water supplied to the first mixer, control of the flow rates of the first chemical liquid and the dilution water to the second mixer includes performing feedback control based on the respective flow rates of the first chemical liquid and the dilution water supplied to the second mixer, control of the flow rates of the second chemical liquid and the dilution water to the third mixer includes performing feedback control based on the respective flow rates of the second chemical liquid and the dilution water supplied to the third mixer, and control of the flow rates of the second chemical liquid and the dilution water to the fourth mixer includes performing feedback control based on the respective flow rates of the second chemical liquid and the dilution water supplied to the fourth mixer.

According to an embodiment of the invention, the cleaning chemical liquid supply method includes at least one of processes (1) to (4) as follows: (1) the process of controlling the flow rates of the first chemical liquid and the dilution water while supplying the first chemical liquid and the dilution water to the first mixer is controlled so that, at an early stage of cleaning of the substrate, a concentration and/or a flow rate of the first chemical liquid supplied to the first position of the substrate from the first mixer is relatively high, (2) the process of controlling the flow rates of the first chemical liquid and the dilution water while supplying the first chemical liquid and the dilution water to the second mixer is controlled so that, at the early stage of cleaning of the substrate, a concentration and/or a flow rate of the first chemical liquid supplied to the second position of the substrate from the second mixer is relatively high, (3) the process of controlling the flow rates of the second chemical liquid and the dilution water while supplying the second chemical liquid and the dilution water to the third mixer is controlled so that, at the early stage of cleaning of the substrate, a concentration and/or a flow rate of the second chemical liquid supplied to the third position of the substrate from the third mixer is relatively high, and (4) the process of controlling the flow rates of the second chemical liquid and the dilution water while supplying the second chemical liquid and the dilution water to the fourth mixer is controlled so that, at the early stage of cleaning of the substrate, a concentration and/or a flow rate of the second chemical liquid supplied to the fourth position of the substrate from the fourth mixer is relatively high.

According to an embodiment of the invention, in the cleaning chemical liquid supply device, one of the first chemical liquid and the second chemical liquid is an alkaline chemical liquid, and the other is an acid chemical liquid.

What is claimed is:

1. A cleaning chemical liquid supply method for supplying a chemical liquid for cleaning a substrate to a cleaning device, the cleaning chemical liquid supply method comprising:
    a process of controlling flow rates of a first chemical liquid and dilution water while supplying the first chemical liquid and the dilution water to a first mixer;
    a process of supplying the first chemical liquid after dilution to a first position of the substrate from the first mixer through a first nozzle;
    a process of controlling flow rates of the first chemical liquid and the dilution water while supplying the first chemical liquid and the dilution water to a second mixer;
    a process of supplying the first chemical liquid after dilution to a second position, differing from the first position, of the substrate from the second mixer through a second nozzle;
    a process of controlling flow rates of a second chemical liquid and the dilution water while supplying the second chemical liquid and the dilution water to a third mixer;
    a process of supplying the second chemical liquid after dilution to a third position of the substrate from the third mixer through a third nozzle;
    a process of controlling flow rates of the second chemical liquid and the dilution water while supplying the second chemical liquid and the dilution water to a fourth mixer; and
    a process of supplying the second chemical liquid after dilution to a fourth position, differing from the third position, of the substrate from the fourth mixer through a fourth nozzle,
    wherein one of the first chemical liquid and the second chemical liquid is an alkaline chemical liquid, and the other is an acid chemical liquid,
    wherein the first position of the substrate is on an upper surface of the substrate,
    the second position of the substrate is on a lower surface of the substrate,
    the third position of the substrate is on the upper surface of the substrate,
    the fourth position of the substrate is on the lower surface of the substrate, and
    wherein a concentration of the first chemical liquid supplied to the first position of the substrate from the first mixer is higher than a concentration of the first chemical liquid supplied to the second position of the substrate from the second mixer, and a flow rate of the first chemical liquid supplied to the first position of the substrate from the first mixer is higher than a flow rate of the first chemical liquid supplied to the second position of the substrate from the second mixer; and
    a concentration of the second chemical liquid supplied to the third position of the substrate from the third mixer is higher than a concentration of the second chemical liquid supplied to the fourth position of the substrate from the fourth mixer, and a flow rate of the second chemical liquid supplied to the third position of the substrate from the third mixer is higher than a flow rate of the second chemical liquid supplied to the fourth position of the substrate from the fourth mixer, wherein the first, second, third and fourth positions are disposed in a same cleaning tank.

2. The cleaning chemical liquid supply method as claimed in claim 1,
    wherein control of the flow rates of the first chemical liquid and the dilution water to the first mixer includes performing feedback control based on the respective flow rates of the first chemical liquid and the dilution water supplied to the first mixer,
    control of the flow rates of the first chemical liquid and the dilution water to the second mixer includes performing feedback control based on the respective flow rates of the first chemical liquid and the dilution water supplied to the second mixer,
    control of the flow rates of the second chemical liquid and the dilution water to the third mixer includes performing feedback control based on the respective flow rates of the second chemical liquid and the dilution water supplied to the third mixer, and
    control of the flow rates of the second chemical liquid and the dilution water to the fourth mixer includes performing feedback control based on the respective flow rates of the second chemical liquid and the dilution water supplied to the fourth mixer.

3. The cleaning chemical liquid supply method as claimed in claim 1, wherein the flow rate of the dilution water is controlled by a first dilution water closed loop controller (CLC) before supplying to the first mixer, the flow rate of the dilution water is controlled by a second dilution water CLC before supplying to the second mixer, the flow rate of the dilution water is controlled by a third dilution water CLC before supplying to the third mixer, and the flow rate of the dilution water is controlled by a fourth dilution water CLC before supplying to the fourth mixer.

4. The cleaning chemical liquid supply method as claimed in claim 1, wherein the first chemical liquid flows into a first utility box before flowing into the first mixer and the second mixer, the first utility box is connected to a pipe from a de-ionized water (DIW) supply source, and when the substrate is not being cleaned by using the first to fourth nozzles, a process of flushing is performed to a pipe from the first utility box to the first and second mixers by the pipe from the de-ionized water (DIW) supply source.

5. The cleaning chemical liquid supply method as claimed in claim 4, wherein the process of flushing is performed when the substrate is provided in a waiting part.

6. The cleaning chemical liquid supply method as claimed in claim 1, wherein the first and second mixers and first and second chemical liquid closed loop controller (CLC) are disposed in a first dilution box, and the third and fourth mixers and third and fourth chemical liquid CLC are disposed in a second dilution box.

7. The cleaning chemical liquid supply method as claimed in claim 6, wherein the flow rate of the first chemical liquid is controlled by the first chemical liquid CLC before supplying to the first mixer and is controlled by the second chemical liquid CLC before supplying to the second mixer, and the flow rate of the second chemical liquid is controlled by the third chemical liquid CLC before supplying to the third mixer and is controlled by the fourth chemical liquid CLC before supplying to the fourth mixer.

* * * * *